United States Patent
Ma et al.

(10) Patent No.: US 6,329,234 B1
(45) Date of Patent: Dec. 11, 2001

(54) COPPER PROCESS COMPATIBLE CMOS METAL-INSULATOR-METAL CAPACITOR STRUCTURE AND ITS PROCESS FLOW

(75) Inventors: Ssu-Pin Ma, Taipei; Chun-Hon Chen; Ta-Hsun Yeh, both of Hsin-chu; Kuo-Reay Peng, Funsung; Heng-Ming Hsu, Hsin-chu; Kong-Beng Thei, Hsin-chu; Chi-Wu Chou, Hsin-chu; Yen-Shih Ho, Hsin-chu, all of (TW)

(73) Assignee: Taiwan Semiconductor Manufactuirng Company, Hsin-chu (TW)

( * ) Notice: Subject to any disclaimer, the term of this patent is extended or adjusted under 35 U.S.C. 154(b) by 0 days.

(21) Appl. No.: 09/624,026

(22) Filed: Jul. 24, 2000

(51) Int. Cl.[7] .................................................. H01L 21/8238
(52) U.S. Cl. .......................... 438/210; 438/241; 438/253; 257/301; 257/306; 257/528
(58) Field of Search .................................. 438/210, 241, 438/253; 257/301, 306, 528

(56) References Cited

U.S. PATENT DOCUMENTS

| | | | |
|---|---|---|---|
| 5,194,932 | 3/1993 | Kurisu | 257/773 |
| 5,208,726 | 5/1993 | Apel | 257/532 |
| 5,293,510 | 3/1994 | Takenaka | 257/295 |
| 5,406,447 | 4/1995 | Miyazaki | 301/313 |
| 5,675,184 | 10/1997 | Matsubayashi et al. | 257/728 |
| 5,726,083 * | 3/1998 | Takaishi | 438/210 |
| 5,879,985 | 3/1999 | Gambino et al. | 438/253 |
| 5,932,906 * | 8/1999 | Shimizu | 257/306 |
| 5,946,569 * | 8/1999 | Huang | 438/253 |
| 5,998,276 * | 12/1999 | Batra et al. | 438/382 |
| 6,146,941 * | 11/2000 | Huang et al. | 438/253 |
| 6,184,076 * | 2/2001 | Huang | 438/241 |
| 6,258,653 * | 7/2001 | Chew et al. | 438/239 |
| 6,259,128 * | 7/2001 | Adler et al. | 257/301 |

* cited by examiner

*Primary Examiner*—Charles Bowers
*Assistant Examiner*—David S. Blum
(74) *Attorney, Agent, or Firm*—George O. Saile; Stephen B. Ackerman

(57) ABSTRACT

In many mixed-signal or radio frequency Rf applications, inductors and capacitors are needed at the same time. For a high performance inductor devices, a thick metal layer is needed to increase performance, usually requiring an extra masking process. The present invention describes both a structure and method of fabricating both copper metal-insulator-metal (MIM) capacitors and thick metal inductors, simultaneously, with only one mask, for high frequency mixed-signal or Rf, CMOS applications, in a damascene and dual damascene trench/via process. High performance device structures formed by this invention include: parallel plate capacitor bottom metal (CBM) electrodes and capacitor top metal (CTM) electrodes, metal-insulator-metal (MIM) capacitors, thick inductor metal wiring, interconnects and contact vias.

34 Claims, 5 Drawing Sheets

COPPER PROCESS COMPATIBLE CMOS METAL-INSULATOR-METAL CAPACITOR STRUCTURE AND ITS PROCESS FLOW

BACKGROUND OF THE INVENTION (1) Field of the Invention

The present invention describes both a structure and method of fabricating copper metal-insulator-metal (MIM) capacitors and thick metal inductors simultaneously, with only one addition mask, for high frequency mixed-signal or Rf, CMOS applications, in a dual damascene trench and via process.

(2) Description of Related Art

As a background to the current invention, in many mixed signal or high frequency Rf applications both high performance, high speed capacitors and inductors are required. Low series resistance, low loss, high Q and low (RC) time constants are required in these high frequency applications for high performance. In addition, it is important to fabricate device structures by processes compatible with CMOS processing with AlCu alloys to pure copper in dual damascene structures.

A metal-insulator-metal (MIM) capacitor is used commonly in high performance applications in CMOS technology. Typically, the capacitor has a sandwich structure and can be described as a parallel plate capacitor. The capacitor top metal (CTM) is separated from the capacitor bottom metal (CBM) by a thin insulating layer. Both two parallel plates are conventionally made from Al or AlCu alloys. These metals are patterned and etched needing several photolithography photo masking steps. The thin insulating dielectric layer is usually made from silicon oxide or silicon nitride deposited by chemical vapor deposition (CVD).

The damascene processing is a "standard" method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners, underlying diffusion barriers, have been coated with chemical vapor deposited (CVD) W metal, then polished back to oxide.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

Another metal deposition, besides sputtering techniques, has been adapted as a standard for copper metallization. This technique is electrochemical deposition (ECD) of copper. The electrochemical copper deposition (ECD) still needs, e.g., sputtering techniques, physical vapor deposition (PVD), to deposit thin underlying diffusion barrier film (Ta,TaN) and a conductive "seed" layer of copper.

Related patents and relevant literature now follow as Prior Art, summarized below.

U.S. Pat. No. 5,879,985 entitled "Crown Capacitor Using a Tapered Etch of a Damascene Lower Electrode" granted Mar. 9. 1999 to Gambino et al. shows a capacitor using a damascene process for the lower electrode. Upper capacitor structure has a "crown" type structure.

U.S. Pat. No. 5,406,447 entitled "Capacitor Used in an Integrated Circuit and Comprising Opposing Electrodes Having Barrier Metal Films in Contact with a Dielectric Film" granted Apr. 11, 1995 to Miyazaki teaches a process for a planar metal-insulator-metal (MIM) capacitor. Barrier metal films are composed of platinum, palladium, tantalum, or titanium nitride. The capacitor dielectric material is either tantalum oxide or a perovskite oxide, such as strontium titanate or a composite of lead zirconate and lead titanate, which are ferroelectric type materials.

U.S. Pat. No. 5,208,726 entitled "Metal-Insulator-Metal (MIM) Capacitor-Around-Via Structure for a Monolithic Microwave Integrated Circuit (MMIC) and Method of Manufacturing Same" granted May 4, 1993 to Apel teaches a MIM capacitor structure and method for monolithic microwave IC applications. A low inductance connection is provided between a front side MIM capacitor and a backside ground plane.

U.S. Pat. No. 5,194,932 entitled "Semiconductor Integrated Circuit Device" granted Mar. 16, 1993 to Kurisu teaches a metal-insulator-metal (MIM) capacitor method. The ground pattern, the insulating inter layer, and the power source pattern come together to form a MIM type capacitor.

U.S. Pat. No. 5,293,510 entitled "Semiconductor Device with Ferroelectric and Method of Manufacturing the Same" granted Mar. 8. 1994 to Takenaka discloses a ferroelectric capacitor process.

U.S. Pat. No. 5,675,184 entitled "Integrated Circuit Device" granted Oct. 7, 1997 to Matsubayashi et al. teaches a metal-insulator-metal (MIM) capacitor process in an Rf application. Thermoplastic material and magnetic substance layers are described.

SUMMARY OF THE INVENTION

The present invention describes a structure and method of fabricating copper metal-insulator-metal (MIM) capacitors and thick metal inductors simultaneously, using only one photolithography mask, for high frequency, mixed-signal or Rf, CMOS applications, in a dual damascene trench and via process.

The structure and process embodiments of this invention start with the first process step, the forming by damascene and chemical mechanical polishing (CMP) the first level inlaid metal structures. The process sequence is as follows: an insulating layer is deposited. This first insulating layer, e.g., silicon oxide, is patterned and reactive ion etched (RIE) upon a semiconductor substrate. The next processing step in building of the damascene structure, is the deposition by sputtering (PVD, physical vapor deposition) and patterning of a thin metal barrier layer (trench liner), e.g. Ta,TaN, and a thin copper seed layer. Copper metal is deposited upon the seed layer in the openings in insulator by electrochemical copper deposition (ECD). The excess copper metal is polished off and planarized with surface by chemical mechanical polishing (CMP) forming the first level metal for the capacitor bottom metal (CBM) layer.

Continuing with the summation of the structure and process embodiments of this invention, is the second step in this CMOS process, the deposition of a copper metal protecting "buffer layer". This layer is needed to prevent copper corrosion with silicon oxide layers. It is deposited over the first level inlaid metal structures and first insulator layer. This buffer layer is, e.g., silicon nitride. The third process step is the blanket deposition of an intermetal dielectric (IMD) layer upon the buffer layer. This intermetal dielectric (IMD) is, e.g., silicon oxide, silicon nitride, or FSG fluorosilicate glass, or PSG phosphosilicate glass. The fourth step is to form a photoresist masking layer by a lithography process, defining simultaneously both the metal-insulator-metal (MIM) capacitor and inductor area, over the first level of metal. Photoresist is coated and patterned upon the intermetal dielectric (IMD) layer. A reactive ion etch (RIE) is performed to etch the intermetal dielectric layer (IMD) layer, forming openings and stopping on the buffer layer. The fifth step is removal of the photoresist material and the metal protecting buffer layer in the exposed opening areas. The sixth and seventh steps are the deposition of both a insulating protecting buffer layer, i.e., silicon nitride, and an insulating layer, i.e., silicon oxide.

Another embodiment of this invention is that the insulating protecting buffer layer (described above) and the insulator layer (described above) can be combined into just one silicon nitride layer, as an alternate process step. This consolidates the processing.

Continuing with the summation of the structure and process embodiments of this invention is the eighth step, the deposition of a conducting metal buffer layer, i.e., tantalum nitride. The ninth step is the formation of a "standard" dual damascene structure with contact via and interconnect trench. In addition, the metal-insulator-metal (MIM) capacitor and inductor structures are nearly completed in the following processes. The via and trench structures are produced by photoresist patterning and reactive ion etching (RIE) processes primarily in the layer of intermetal dielectric (IMD). Also etched in this part of a standard dual damascene process are the conducting metal buffer layer, insulator layer, insulating protecting buffer layer and the copper metal protecting "buffer layer".

A key process step and yet another embodiment of this invention is that the metal-insulator-metal capacitor (MIM) and inductor areas are protected during the aforementioned standard dual damascene process. The patterning photoresist is stripped exposing all open areas: trench/via area and MIM/Inductor area. Next, all the open areas in the intermetal (IMD) consisting of MIM/Inductor area, via and trench (for interconnect line) structures are filled with a conductive metal protect buffer layer, tantalum nitride.

Another key embodiment of this invention is the tenth process in this CMOS compatible process. This processing step is the processing needed to form simultaneously: both the standard dual damascene copper metals structures with contact vias, interconnect trenches and metal-insulator-metal (MIM) capacitors and, at the same time, inductors structures. The open areas in the intermetal dielectric (IMD) consists of: MIM/Inductor areas, vias and trenches (interconnect lines) structures. These open areas are filled with a conductive copper metal on top of the conductive metal protect buffer layer.

Continuing with the summation of the structure and process embodiments of this invention is the eleventh process step. This processing step is the forming simultaneously of standard dual damascene copper metals structures with contact via, interconnect trench and, at the same time, both the metal-insulator-metal (MIM) capacitor and inductor structures by damascene and chemical mechanical polishing (CMP) back the excess metal to form inlaid copper metal structures. The excess copper metal and excess conductive metal protect buffer layer are polished off and planarized with surface by chemical mechanical polishing (CMP) forming inlaid copper which remains in the open regions. An embodiment of this invention, which is both a process and structure variation, is to chem-mech polish back: both the excess copper (described above) and the excess metal protect buffer layer (described above), polishing through the excess insulator layer and stopping on the insulating protect buffer layer.

In yet another embodiment of the present invention is another process variation or process option of tile eleventh step, which is to chem-mech polish back: both the excess copper and excess metal protect buffer layer, polishing through both the excess insulator layer and the excess insulating protect buffer layer, and finally stopping on the intermetal dielectric (IMD) layer. The end result is the formation, by damascene and chemical mechanical polishing (CMP), of inlaid copper metal structures (with slightly more copper metal removal than described in the previous process step): interconnect/trench, contact/via and MIM/inductor.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENT

Figure 1:
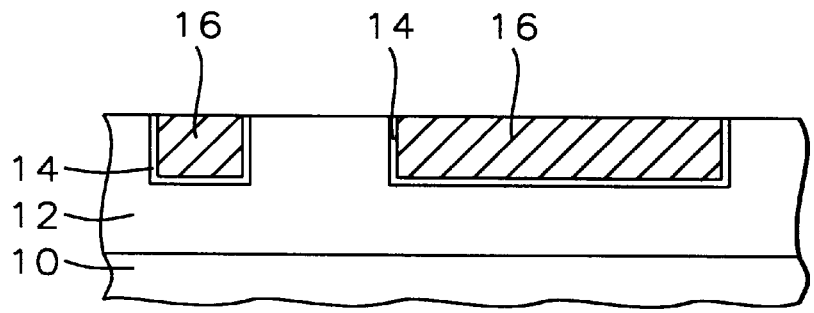
FIG. 1, which in cross-sectional representation, is sketched the first step in this CMOS process, the forming by damascene and CMP the first level inlaid metal structures.

The present invention teaches a new and improved structure and method of fabricating copper metal-insulator-metal (MIM) capacitors and thick metal inductors, simultaneously, with only one mask, for high frequency, mixed-signal or Rf, CMOS applications, in a dual damascene trench and via process.

When AC circuit modeling of thin film metal-insulator-metal capacitors, several factors are important for high performance, high frequency Rf applications and modeling gives insight into desired structure, process and material properties. Firstly, these thin film capacitors can be modeled as parallel plate capacitors. Several factors become important at high frequencies: C, capacitance versus f, frequency response, ESR, equivalent series resistance at a fixed frequency, EPR, equivalent parallel resistance at a fixed frequency, and tan delta or loss factor, D. Good electrical properties for metal-insulator-metal (MIM) thin film capacitors are: the C vs f almost flat from 10 KHz to 1 GHz, and D vs f with low D values. The key term for high frequency applications is the values of the ESR, which should be low resistance (in Ohms). An increase in the loss factor D with frequency indicates a series resistance loss problem; conversely, a decrease in D with increasing frequency indicates a parallel resistance loss problem. A combination of the mechanisms can also occur yielding $D_{max}$ and $D_{min}$ values vs f. As mentioned above, these modeling values are important in high performance device applications and can give insight into the material and structure of the MIM capacitors. For example, in using a silicon crystal as an electrode, the resistance of the silicon is important in yielding a high ESR term. The series resistance terms were found to be much higher for silicon electrodes than for metallic electrodes, due to the higher resistance of the semiconductor.

Furthermore, important to this invention, low resistance metal lines for high frequency inductor devices are also important for high performance. Thick metal lines for inductor devices improve the high frequency performance and these thick metal lines are necessary in these high frequency, mixed-signal or Rf, CMOS applications, usually requiring a special, separate and extra photo masking step.

For modeling the MIM capacitor, for high frequency applications, the capacitor components can be represented by an R-C equivalent circuit. Some of the key terms are: $R_c$, contact (ohmic) resistance, $R_p$, resistance which characterizes leakage through dielectric, and $R_s$, internal series resistance of the dielectric. Best high frequency properties are for an "ideal" MIM capacitor are achieved by the following: $R_p$, equivalent parallel resistance (which characterizes leakage through dielectric) approaches infinity, while both the $R_c$, contact (ohmic) resistance, and the $R_s$, internal series resistance of the dielectric both approach zero. The high frequency, high performance inductor, capacitor and resistor device properties can be characterized, tested, measured and modeled by an LCR bridge instrument or network analyzer.

The metal-insulator-capacitor (MIM) in the present invention is formed with copper electrodes and tne insulator is silicon oxide, deposited by chemical vapor deposition (CVD) with a dielectric constant of about 3.9 in a thickness range from about 100 to 600 Angstroms.

Referring to FIG. 1 illustrated in cross-sectional drawing, is sketched the start of the structure and process embodiments of this invention. The general process of the present invention is described in the following. The first step (for reference STEP ONE) in this CMOS process is the forming by damascene and chemical mechanical polishing (CMP) the first level inlaid metal structures 16. The process sequence is as follows: an insulating layer 12 is deposited. This first insulating layer 12 or layer of dielectric, e.g., silicon oxide, is patterned and reactive ion etchea (RIE) upon a semiconductor substrate 10. The next processing step in building of the damascene structure, is the deposition by sputtering (PVD, physical vapor deposition) and patterning of a thin metal barrier layer 14 or barrier material (trench liner), e.g. Ta,TaN, and a thin copper seed layer (too thin to sketch in Figs.), for subsequent electrochemical copper deposition (ECD) of copper. Copper metal is deposited upon the seed layer in the openings in insulator 12 by electrochemical copper deposition (ECD). The excess copper metal is polished off and planarized with surface by chemical mechanical polishing (CMP) forming the first level conductor wiring 16 (copper metal remaining inlaid in the open regions) for the capacitor bottom metal (CBM) 16 layer, which is in thickness range from approximately 5,000 to 12,000 Angstroms.

Figure 2:
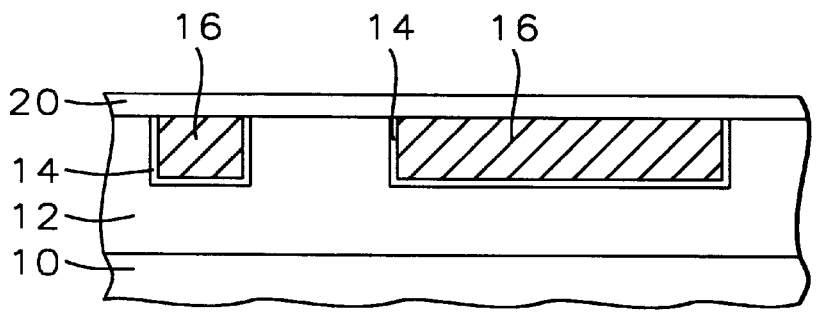
FIG. 2, which illustrated in cross-sectional drawing, is sketched the second step in this CMOS process, the deposition of a copper metal protecting "buffer layer".

Referring to FIG. 2 illustrated in cross-sectional drawing, is sketched a continuation of the structure and process embodiments of this invention. The second step (for reference STEP TWO) in this CMOS process is the deposition of a copper metal protect "buffer layer" 20, needed to prevent copper corrosion with silicon oxide layers, over the first level inlaid metal structures 16 and first insulator layer 12. This buffer layer 20 is, e.g., silicon nitride, thickness range from approximately 200 to 1,200 Argstroms.

Figure 3:
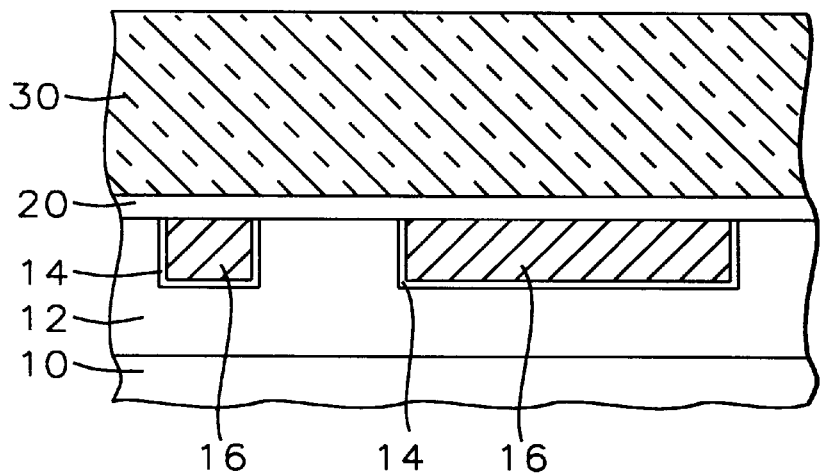
FIG. 3, which illustrated in cross-sectional drawing, is the third step in this CMOS process, the blanket deposition of an intermetal dielectric (IMD) layer.

Referring to FIG. 3 illustrated in cross-sectional drawing, is sketched a continuation of the structure and process embodiments of this invention. The third step (for reference STEP THREE) in this CMOS process is the blanket deposition of an intermetal dielectric (IMD) layer 30 upon the buffer layer 20. This intermetal dielectric (IMD) is, e.g., silicon oxide, silicon nitride deposited by chemical vapor deposition (CVD), or FSG fluoro-silicate glass, or PSG phosphosilicate glass.

Figure 4:
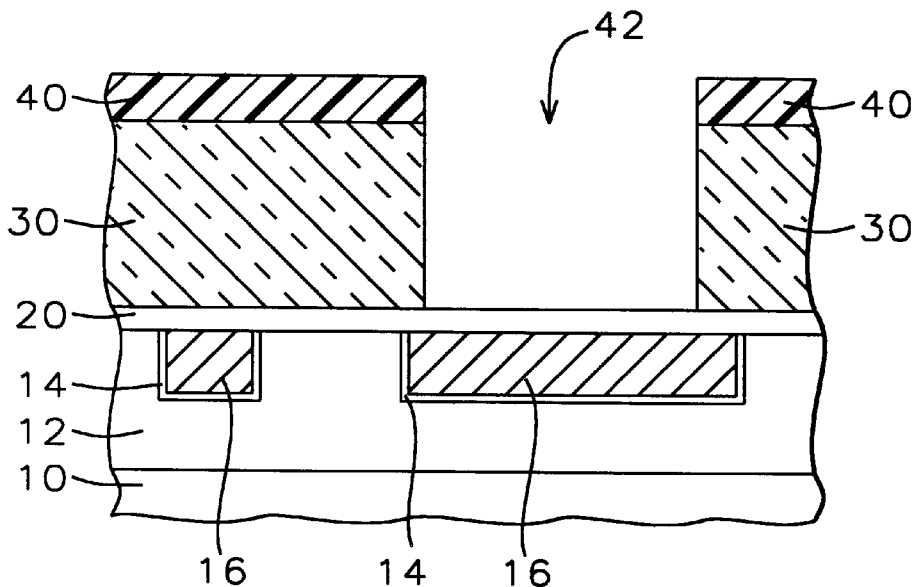
FIG. 4, which illustrated in cross-sectional drawing, is the fourth step in this CMOS process, the forming by a photolithography process simultaneously both the metal-insulator-metal (MIM) capacitor and inductor area, over the first level of metal.

Referring to FIG. 4 illustrated in cross-sectional drawing, is sketched a continuation of the structure and process embodiments of this invention. The fourth step (for reference STEP FOUR) in this CMOS process is to form a photoresist masking layer by a lithography process, defining simultaneously both the metal-insulator-metal (MIM) capacitor and inductor area 42, over select portions of the first level of metal 16. Photoresist 40 is coated and patterned upon the intermetal dielectric (IMD) layer 30. A reactive ion etch (RIE) is performed to etch the intermetal dielectric layer (IMD) layer 30, forming opening 42, termed MIM/inductor damascene openings, and stopping on the buffer layer 20. Again, this etched intermetal dielectric (IMD) is, e.g., silicon oxide, silicon nitride, or FSG fluoro-silicate glass, or PSG phosphosilicate glass.

Figure 5:
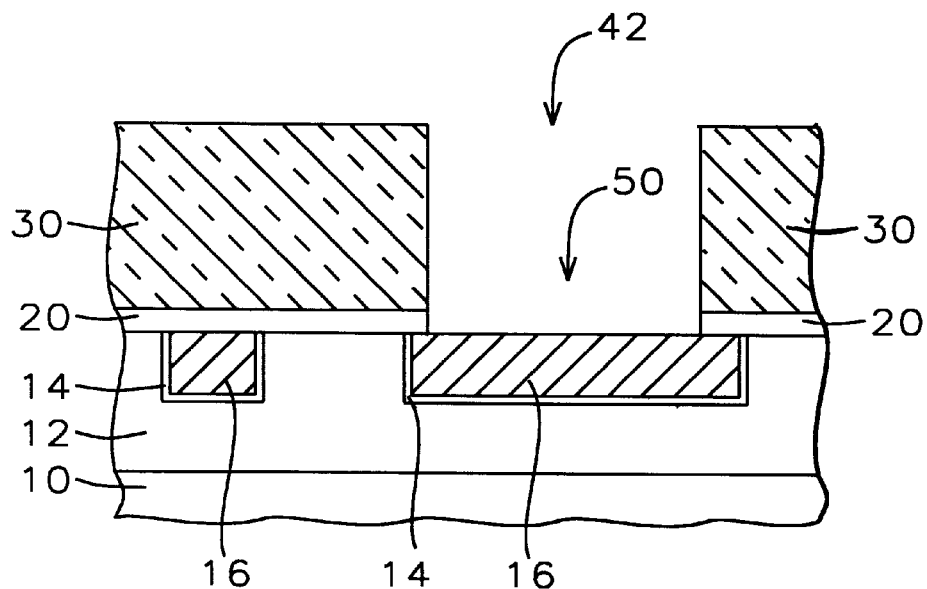
FIG. 5, which illustrated in cross-sectional drawing, shows the fifth step in this CMOS process, the removal of the photoresist material and the metal protecting buffer layer, that is exposed in the opening.

Referring to FIG. 5 illustrated in cross-sectional drawing, is sketched a continuation of the structure and process embodiments of this invention. The fifth step (for reference STEP FIVE) in this CMOS process is removal of the photoresist material 40 (in FIG. 4) and the metal protecting buffer layer 20 in the exposed opening 50.

Figure 6:
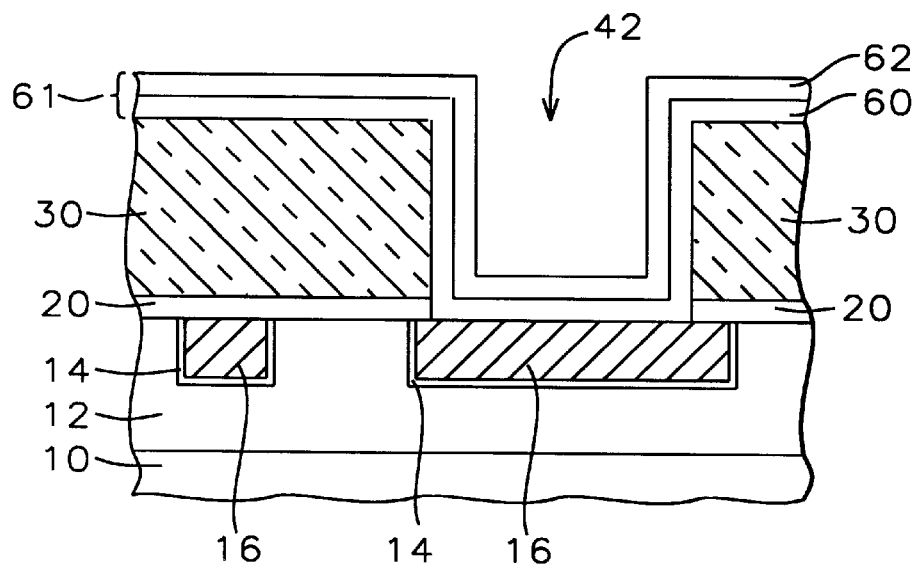
FIG. 6, which in cross-sectional representation, illustrates the sixth and seventh steps in this CMOS process, the deposition of both a insulating protecting buffer layer and an insulating layer.

Referring to FIG. 6 illustrated in cross-sectional drawing, is sketched a continuation of the structure and process embodiments of this invention. The sixth and seventh steps (for reference STEP SIX and STEP SEVEN) in this CMOS process are the deposition of both an insulating protect buffer layer 60, i.e., silicon nitride, and an MIM insulating layer 62, i.e., silicon oxide. Another embodiment is that the insulating protecting buffer layer 60 and the insulator layer 62 can be combined into just one silicon nitride layer 61, as an alternate process step.

The metal-insulator-capacitor (MIM) in the present invention is formed with copper electrodes and the MIM insulating layer can be, as described above in FIG. 6, silicon oxide (62), deposited by chemical vapor deposition (CVD) with a dielectric constant of about 3.9, in a thickness range from about 100 to 600 Angstroms.

Figure 7:
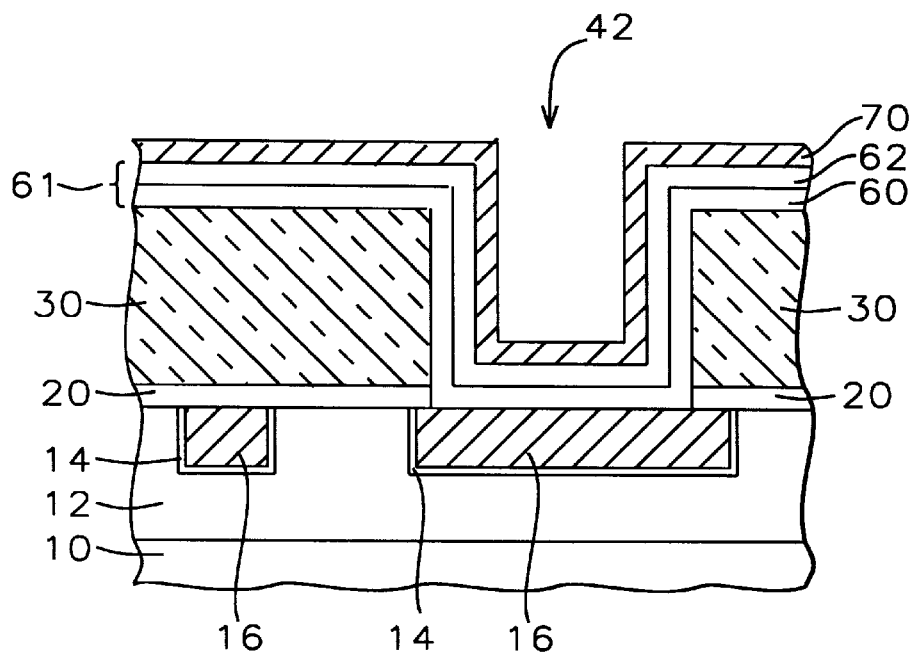
FIG. 7, which in cross-sectional representation, illustrates the eighth step in this CMOS process, the deposition of a conducting metal buffer.

Referring to FIG. 7 illustrated in cross-sectional drawing, is sketched a continuation of the structure and process embodiments of this invention. The eighth step (for reference STEP EIGHT) in this CMOS process is the deposition of a conducting metal buffer layer 70, i.e., tantalum nitride.

Figure 8:
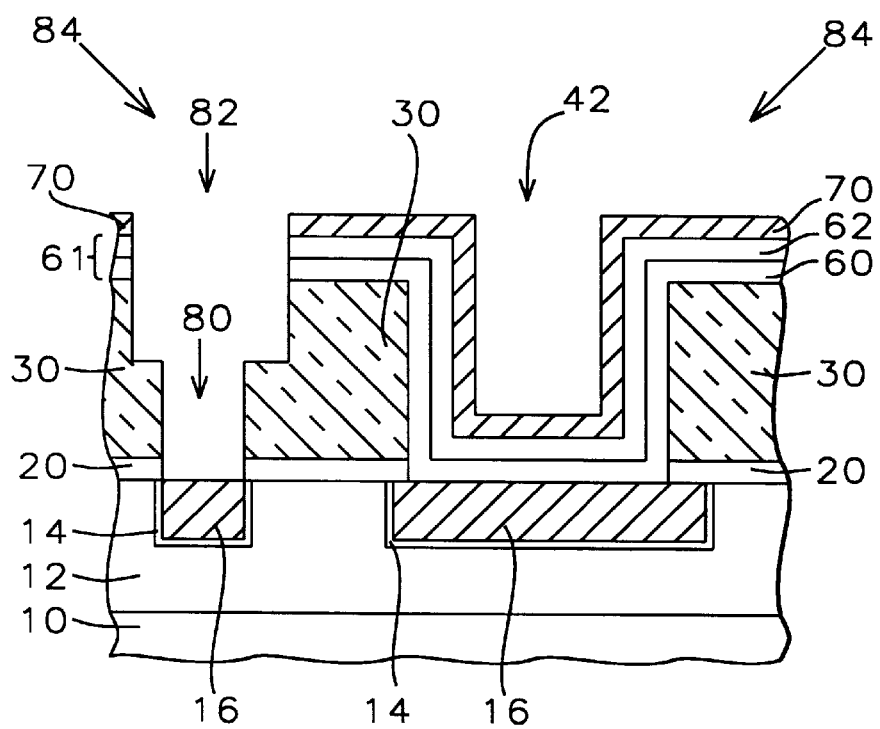
FIG. 8, which in cross-sectional representation, illustrates the ninth step in this CMOS process, the formation of a "standard" dual damascene structure with contact via and interconnect trench.

Referring to FIG. 8 illustrated in cross-sectional drawing, is sketched a continuation of the structure and process embodiments of this invention. The ninth step (for reference STEP NINE) in this CMOS process is the formation of a "standard" dual damascene structure with contact via and interconnect trench. In addition, the metal-insulator-metal (MIM) capacitor and inductor structures are nearly completed in the following processes. Referring to FIG. 8, the via 80 and trench 82 structures are produced by photoresist patterning and reactive ion etching (RIE) processes primarily in the layer of intermetal dielectric 30 (IMD). Also etched in this part of a standard dual damascene process are the conducting metal buffer layer 70, insulator latter 62, insulating protecting buffer layer 60 and the copper metal protecting "buffer layer" 20. One key process step and another embodiment of this invention is that the metal-insulator-metal capacitor (MIM) and inductor areas 42 are protected during the above standard dual damascene process. The patterning photoresist is stripped exposing all open areas: trench/via area and MIM/Inductor area. Next, all the open areas in the intermetal dielectric (IMD) consisting of MIM/Inductor area 42, via 80 and trench 82 (interconnect line) structures are filled with a conductive metal protect buffer layer 84, tantalum nitride (too thin to be shown in Figs).

Figure 9:
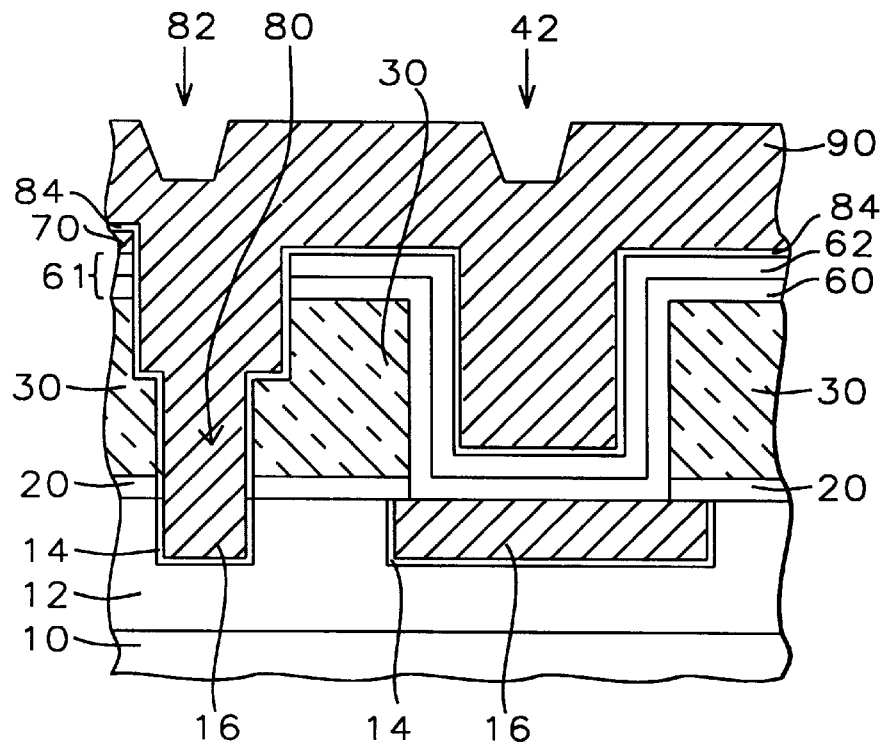
FIG. 9, which in cross-sectional representation, illustrates the tenth step in this CMOS process, the processing used to form simultaneously: both standard dual damascene copper metals structures and metal-insulator-metal (MIM) capacitor and inductor structures.

Referring to FIG. 9 illustrated in cross-sectional drawing, is sketched a continuation of the structure and process embodiments of this invention. The tenth step (for reference STEP TEN) in this CMOS process is the processing step needed to form simultaneously: both standard dual damascene copper metals structures with contact via, interconnect trench and, at the same time, the metal-insulator-metal (MIM) capacitor and inductor structures. Referring to FIG. 9, the open areas in the intermetal dielectric (IMD) consisting of MIM/Inductor area 42, via 80 and trench 82 (interconnect line) structures are filled with thick conductive copper metal 90 on top of the conductive metal protect buffer layer 84 (too thin to be shown in Figs). The thick copper is useful for the inductor device (not shown in FIG. 9). The thick copper is deposited by electrochemical deposition (ECD), in a thickness range from approximately 5,000 to 21,000 Angstroms.

Figure 10:
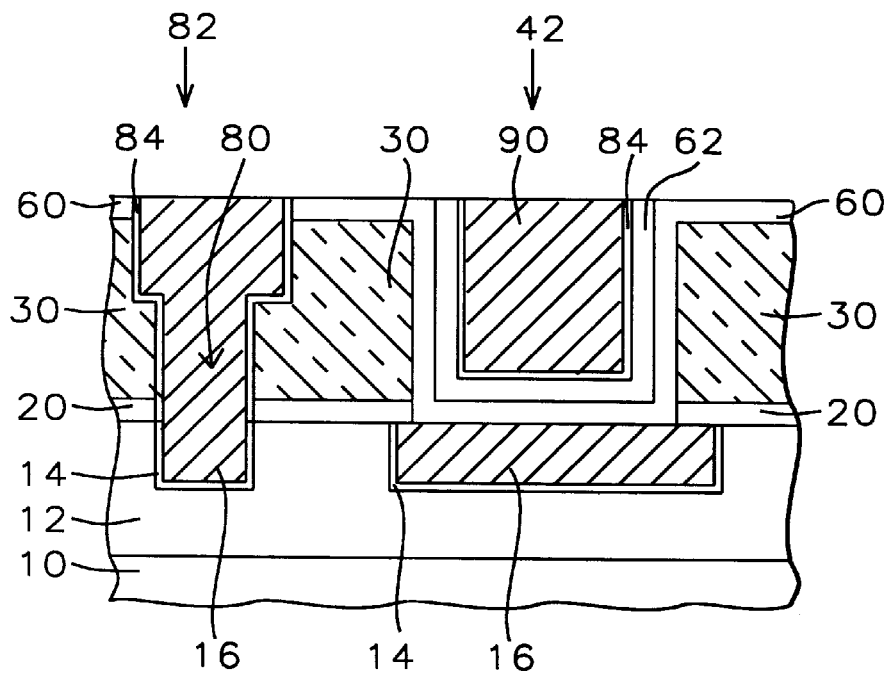
FIG. 10, which in cross-sectional represertation, illustrates the eleventh step in this CMOS process, the step to form simultaneously standard dual damascene copper metals structures with contact via, interconnect trench and both the metal-insulator-metal (MIM) capacitor and inductor structures.

Referring to FIG. 10 illustrated in cross-sectional drawing, is sketched a continuation of the structure and process embodiments of this invention. The eleventh step (for reference STEP ELEVEN) in this CMOS process is tne step to form simultaneously standard dual damascene copper metals structures with contact via 80, interconnect trench 82 and, at the same time, both the metal-insulator-metal (MIM) capacitor and inductor structures 42. Referring to FIG. 10, in this CMOS process step is the forming by damascene and chemical mechanical polishing (CMP) of the inlaid copper metal structures: interconnect/trench 82, contact/via 80 and MIM/inductor 42. The excess copper metal and excess conductive metal protect buffer layer 84 are polished off and planarized with surface by chemical mechanical polishing (CMP) forming inlaid copper which remains in the open regions. One embodiment and a process and structure variation is to chem-mech polish back the excess copper arid excess metal protect buffer layer, polishing through the excess insulator layer 62 and stopping on the insulating protect buffer layer 60, as shown in FIG. 10.

A brief summary of the metal thickness layers and capacitor dielectric follows. The capacitor top metal (CTM) metal final thickness is from approximately 6000 to 18,000 Angstroms. The interconnect line metal, final thickness is from approximately 2,000 to 15,000 Angstroms. The interconnect/via metal final thickness and final inductor metal line thickness are both from approximately 6,000 to 18,000 Angstroms. The capacitor bottom metal (MIM) layer is in thickness range from approximately 5,000 to 12,000 Angstroms. The metal-insulator-capacitor (MIM) insulator is silicon oxide, deposited by chemical vapor deposition (CVD) with a dielectric constant of about 3.9 in a thickness range from about 100 to 600 Angstroms.

Figure 11:
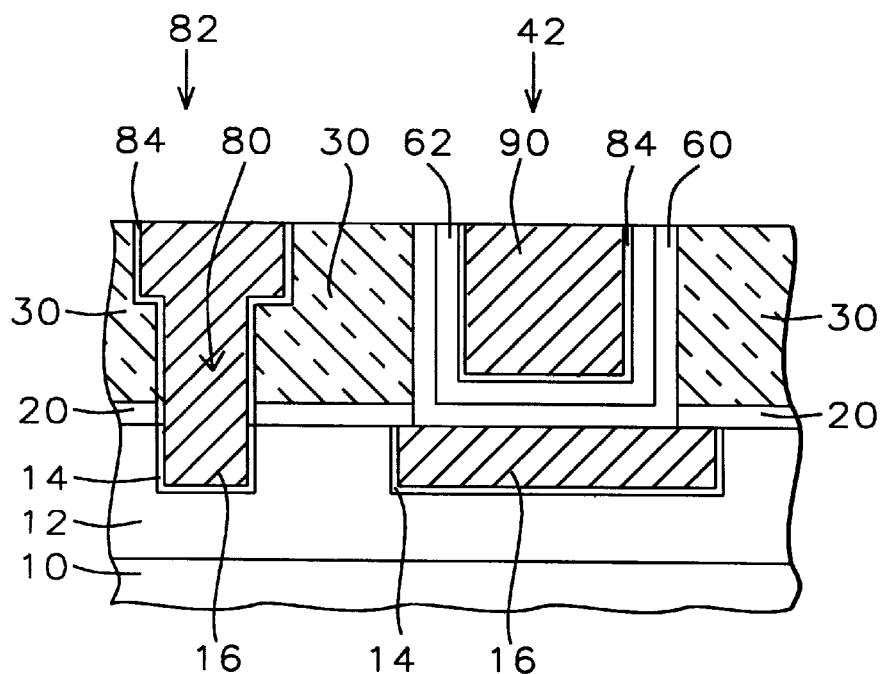
FIG. 11, which in cross-sectional representation, illustrates a process option of the eleventh step in this CMOS process, a process variation, which is a process option. The chem-mech polish back of excess copper and metal protect buffer layer is extended through the excess insulator layer, excess insulating protect buffer layer, and stops on the intermetal dielectric (IMD) layer.

Referring to FIG. 11, illustrated in cross-sectional drawing, is yet another embodiment of the present invention. This is a process option or process variation of the eleventh step in this CMOS process. This process and structure variation is to chem-mech polish back the excess copper and excess metal protect buffer layer, polishing through the excess insulator layer 62 and excess insulating protect buffer layer 60, stopping on the intermetal dielectric (IMD) layer 30. The end result, refer to FIG. 11, is the formation by damascene and chemical mechanical polishing (CMP) the inlaid copper metal structures (with slightly more copper metal removed than in FIG. 10): interconnect,/trench 82, contact/via 80 and MIM/inductor 42.

While the invention has been particularly shown and described with reference to the preferred embodiments thereof, it will be understood by those skilled in the art that various changes in form and details may be made without departing from the spirit and scope of the invention.

What is claimed is:

1. A method for fabricating IC's comprising:

providing a substrate having a layer of dielectric;

providing a first level conductor wiring surrounded by barrier material within the said layer of dielectric;

depositing a metal protect buffer layer over said first level of conductor wiring;

depositing an intermetal dielectric (IMD) layer over said metal protect buffer layer;

patterning and etching MIM/Inductor damascene openings in said intermetal dielectric (IMD) layer and etching to said metal protect buffer layer;

removing the patterning and masking material and removing the exposed metal protect buffer layer;

depositing an insulating protect buffer layer over the patterned intermetal dielectric (IMD) layer and over said first level of conductor wiring;

depositing an MIM insulating layer over said insulating protect buffer layer;

depositing a conducting metal buffer layer over said MIM insulating layer;

patterning and etching dual damascene via/trench openings, or trench/via openings by process reversal, in said intermetal dielectric (IMD) layer and removing all patterning and masking material exposing all openings;

forming conducting metal over said via/trench openings and polishing off excess conducting metal and excess conducting metal protect buffer layer.

2. The method of claim 1, wherein said substrate is semiconductor single crystal silicon or an IC module.

3. The method of claim 1, wherein the process is compatible with CMOS processing, devices and circuits, for both logic and memory applications.

4. The method of claim 1, wherein the trenches or channels for metal interconnects and via hole contact openings contain a barrier, diffusion barrier liner, which also aids adhesion, deposited by sputtering (PVD), liner barrier material selected from the group consisting of Ta, TaN and, in a thickness range from about 100 to 4,000 Angstroms.

5. The method of claim 1, wherein said conductor or conducting material consists of the following: parallel plate capacitor bottom metal (CBM) electrodes and capacitor top metal (CTM) electrodes, Inductor metal wiring, interconnects and contact vias, conducting material selected from the group consisting of Cu, AlCu alloys, AlCuSi alloys, and W.

6. The method of claim 1, wherein the damascene trench or channel interconnects and via hole contacts can be comprised of a copper seed layer liner, for parallel plate capacitor bottom metal (CBM) electrodes and capacitor top metal (CTM) electrodes, Inductor metal wiring, interconnects and contact vias, deposited by sputtering (PVD), seed type materials comprising of thin Cu, thickness from about 1,000 to 10,000 Angstroms.

7. The method of claim 1, wherein the damascene inlaid conducting material layers forming conducting interconnect lines and contact vias for parallel plate capacitor bottom metal (CBM) electrodes and capacitor top metal (CTM) electrodes, Inductor metal wiring, interconnects and contact vias, can be comprised of copper by electrochemical deposition (ECD), upon the copper seed layer, ECD Cu thickness from 4,000 to 40,000 Angstroms.

8. The method of claim 1, wherein the copper, metal protect buffer layer, is silicon nitride.

9. The method of claim 1, wherein the dielectric layers, or layer of dielectric, and intermetal dielectric layer (IMD) or layers, and in general, the insulating layers, are selected from the group consisting of silicon dioxide or silicon oxide, and/or silicon nitride, deposited by chemical vapor deposition (CVD).

10. The method of claim 1, wherein the insulating protect buffer layer is silicon nitride.

11. The method of claim 1, wherein the insulating protect buffer layer can be combined with the MIM insulating layer, as a process option, eliminating the need for a silicon oxide layer as MIM capacitor dielectric, and hence forming just one layer consisting of silicon nitride.

12. The method of claim 1, wherein damascene and dual damascene patterned openings, for subsequent inlaid metal, are formed by the following methods, selected from the group consisting of reactive ion etching (RIE), milling, ion milling, wet etching, or a combination thereof.

13. The method of claim 1, wherein the levels of conducting metal structures are planarized by removing excess conducting material to form inlaid dual damascene conducting metal interconnects, contact vias and metal-insulator-metal (MIM)/Inductors, in trench and via openings, and this process includes planarization by the following methods, selected from the group consisting of planarization by chemical mechanical polish (CMP), milling, ion milling, and/or etching, or a combination thereof.

14. The method of claim 1, wherein one of the final steps in this CMOS process is the forming by damascene and chemical mechanical polishing (CMP) the inlaid copper metal structures: interconnect/trench, contact/via and MIM/inductor by removing the excess copper metal, excess conductive metal protect buffer layer and planarizing the surface by chemical mechanical polishing (CMP), forming inlaid copper, which remains in the open regions.

15. The method of claim 1, wherein as a process variation or option in the one of the final steps in this CMOS process, is to form by damascene and chemical mechanical polishing (CMP) the inlaid copper metal structures: interconnect/trench, contact/via and MIM/inductor by chem-mech polishing (CMP) back both the excess copper and the excess metal protect buffer layer, polishing through the excess insulator layer and stopping on the insulating protect buffer layer.

16. The method of claim 1, wherein another process variation or option in one of the final steps in this CMOS process is to form by damascene and chemical mechanical polishing (CMP) the inlaid copper metal structures: interconnect/trench, contact/via and MIM/inductor by chem-mech polishing (CMP) back both the excess copper and excess metal protect buffer layer, polishing through both the excess insulator layer and the excess insulating protect buffer layer, stopping on the intermetal dielectric (IMD) layer.

17. The method of claim 1, wherein the metal-insulator-capacitor (MIM) insulator is silicon oxide, deposited by chemical vapor deposition (CVD) with a dielectric constant of about 3.9 in a thickness range from about 100 to 600 Angstroms.

18. The method of claim 1, wherein MIM capacitor and inductor devices are comprised of the following thickness of metal: the capacitor top metal (CTM) metal final thickness is from approximately 6,000 to 18,000 Angstroms, the interconnect line metal, final thickness is from approximately 2,000 to 15,000 Angstroms, the interconnect/via metal final thickness and final inductor metal line thickness are both from approximately 6,000 to 18,000 Angstroms, and the capacitor bottom metal (CBM) layer is in thickness range from approximately 5,000 to 12,000 Angstroms.

19. The method of claim 1, wherein multilevel conducting metal interconnects, contact vias and metal-insulator-metal (MIM)/Inductors structures are fabricating by repeating the process described herein.

20. A method of fabricating an integrated circuit on a substrate using damascene processing to form high performance, mixed-signal and high frequency Rf parallel plate capacitors, metal-insulator-metal (MIM) and Inductor devices, simultaneously, using copper metallurgy, for applications in CMOS circuits, the method comprising:

providing a semiconductor single crystal silicon substrate or IC substrate module;

providing a substrate having a layer of dielectric, silicon oxide;

providing a first level conductor wiring surrounded by barrier material within the said layer of dielectric;

depositing a metal protect buffer layer, silicon nitride, over said first level of conductor wiring;

depositing an intermetal dielectric (IMD) layer over said metal protect buffer layer;

patterning by coating, exposing and developing photoresist, forming a metal-insulator-metal capacitor, MIM/Inductor damascene openings, on said intermetal dielectric (IMD) layer, over select portions of said first level conductor wiring;

etching and removing by reactive ion etching (RIE) the intermetal dielectric (IMD) in the exposed MIM/Inductor damascene openings, and etching through the exposed intermetal dielectric (IMD) stopping on the metal protect buffer layer;

removing the patterning and masking material and removing the exposed metal protect buffer layer;

depositing by chemical vapor deposition (CVD) an insulating protect buffer layer, silicon nitride, over the patterned intermetal dielectric (IMD) layer and over said first level of conductor wiring, that is exposed;

depositing an MIM insulating layer over said insulating protect buffer layer;

depositing a conducting metal buffer layer, silicon nitride, over said MIM insulating layer;

patterning by coating, exposing and developing photoresist, to form dual damascene via/trench openings, or trench/via openings by a process reversal, on said intermetal dielectric (IMD), over select portions of said first level conductor wiring, while protecting the MIM/Inductor damascene openings, or areas, with unexposed photoresist;

etching and removing by reactive ion etching (RIE) the exposed intermetal dielectric (IMD) in the intermetal dielectric (IMD) layer, forming dual damascene trench/via openings;

stripping the remaining photoresist, thus forming in the intermetal dielectric (IMD) layer, open areas or openings for both dual damascene trench/via and MIM/Inductor;

depositing thick conducting copper metal, by electrochemical deposition (ECD), over and in the intermetal dielectric (IMD), simultaneously filling all open areas or openings, for both dual damascene trench/via and MIM/Inductor;

polishing off both excess conducting metal and excess conducting metal protect buffer layer by chemical mechanical polishing (CMP) and stopping on the insulating protect buffer layer to form simultaneously, by damascene processing, inlaid metal structures consisting of contact vias, metal interconnect lines, and MIM/Inductors.

21. The method of claim 20, wherein the trenches or channels for metal interconnects and via hole contact openings contain a barrier, diffusion barrier liner, which also aids adhesion, deposited by sputtering (PVD), liner barrier material selected from the group consisting of Ta, TaN and Ta/TaN, in a thickness range from about 100 to 4,000 Angstroms.

22. The method of claim 20, wherein said conductor or conducting material consists of the following: parallel plate capacitor bottom metal (CBM) electrodes and capacitor top metal (CTM) electrodes, Inductor metal wiring, interconnects and contact vias, conducting material selected from the group consisting of Cu, AlCu alloys, AlCuSi alloys, and W.

23. The method of claim 20, wherein the damascene trench or channel interconnects and via hole contacts can be comprised of a copper seed layer liner, for parallel plate capacitor bottom metal (CBM) electrodes and capacitor top metal (CTM) electrodes, Inductor metal wiring, interconnects and contact vias, deposited by sputtering (PVD), seed type materials comprising of thin Cu, thickness from about 1,000 to 10,000 Angstroms.

24. The method of claim 20, wherein the damascene inlaid conducting material layers forming conducting interconnect lines and contact vias for parallel plate capacitor bottom metal (CBM) electrodes and capacitor top metal (CTM) electrodes, Inductor metal wiring, interconnects and contact vias, can be comprised of copper by electrochemical deposition (ECD), upon the copper seed layer, ECD Cu thickness from 4,000 to 40,000 Angstroms.

25. The method of claim 20, wherein the dielectric layers, or layer of dielectric, and intermetal dielectric layer (IMD) or layers, and in general, the insulating layers, are selected from the group consisting of silicon dioxide or silicon oxide, and/or silicon nitride, deposited by chemical vapor deposition (CVD).

26. The method of claim 20, wherein the insulating protect buffer layer can be combined with the MIM insulating layer, as a process option, eliminating the need for a silicon oxide layer as MIM capacitor dielectric, and hence forming just one layer consisting of silicon nitride.

27. The method of claim 20, wherein damascene and dual damascene patterned openings, for subsequent inlaid metal, are formed by the following methods, selected from the group consisting of reactive ion etching (RIE), milling, ion milling, wet etching, or a combination thereof.

28. The method of claim 20, wherein the levels of conducting metal structures are planarized by removing excess conducting material to form inlaid dual damascene conducting metal interconnects, contact vias and metal-insulator-metal (MIM)/Inductors, in trench and via openings, and this process includes planarization by the following methods, selected from the group consisting of planarization by chemical mechanical polish (CMP), milling, ion milling, and/or etching, or a combination thereof.

29. The method of claim 20, wherein one of the final steps in this CMOS process is the forming by damascene and chemical mechanical polishing (CMP) the inlaid copper metal structures: interconnect/trench, contact/via and MIM/inductor by removing the excess copper metal, excess conductive metal protect buffer layer and planarizing the surface by chemical mechanical polishing (CMP), forming inlaid copper, which remains in the open regions.

30. The method of claim 20, wherein as a process variation or option in the one of the final steps in this CMOS process, is to form by damascene and chemical mechanical polishing (CMP) the inlaid copper metal structures: interconnect/trench, contact/via and MIM/inductor by chem-mech polishing (CMP) back both the excess copper and the excess metal protect buffer layer, polishing through the excess insulator layer and stopping on the insulating protect buffer layer.

31. The method of claim 20, wherein another process variation or option in one of the final steps in this CMOS process is to form by damascene and chemical mechanical polishing (CMP) the inlaid copper metal structures: interconnect/trench, contact/via and MIM/inductor by chem-mech polishing (CMP) back both the excess copper and excess metal protect buffer layer, polishing through both the excess insulator laver and the excess insulating protect buffer layer, stopping on the intermetal dielectric (IMD) layer.

32. The method of claim 20, wherein the metal-insulator-capacitor (MIM) insulator is silicon oxide, deposited by chemical vapor deposition (CVD) with a dielectric constant of about 3.9 in a thickness range from about 100 to 600 Angstroms.

33. The method of claim 20, wherein MIM capacitor and inductor devices are comprised of the following thickness of metal: the capacitor top metal (CTM) metal final thickness is from approximately 6,000 to 18,000 Angstroms, the interconnect line metal, final thickness is from approximately 2,000 to 15,000 Angstroms, the interconnect/via metal final thickness and final inductor metal line thickness are both from approximately 6,000 to 18,000 Angstroms, and the capacitor bottom metal (CBM) layer is in thickness range from approximately 5,000 to 12,000 Angstroms.

34. The method of claim 20, wherein multilevel conducting metal interconnects, contact vias and metal-insulator-metal (MIM)/Inductors structures are fabricating by repeating the process described herein.

* * * * *